(12) United States Patent
Diener

(10) Patent No.: US 10,580,619 B2
(45) Date of Patent: Mar. 3, 2020

(54) CIRCUIT ASSEMBLY FOR PROVIDING HIGH-FREQUENCY ENERGY, AND SYSTEM FOR GENERATING AN ELECTRIC DISCHARGE

(71) Applicant: Christof-Herbert Diener, Nagold (DE)

(72) Inventor: Christof-Herbert Diener, Nagold (DE)

( * ) Notice: Subject to any disclaimer, the term of this patent is extended or adjusted under 35 U.S.C. 154(b) by 0 days.

(21) Appl. No.: 16/303,265

(22) PCT Filed: May 4, 2017

(86) PCT No.: PCT/EP2017/060597
§ 371 (c)(1),
(2) Date: Nov. 20, 2018

(87) PCT Pub. No.: WO2017/198469
PCT Pub. Date: Nov. 23, 2017

(65) Prior Publication Data
US 2019/0206656 A1    Jul. 4, 2019

(30) Foreign Application Priority Data
May 20, 2016   (DE) .................. 10 2016 109 343

(51) Int. Cl.
  H01J 37/32    (2006.01)
  H02M 3/156    (2006.01)
  (Continued)

(52) U.S. Cl.
  CPC .. *H01J 37/32174* (2013.01); *H01J 37/32816* (2013.01); *H02M 3/156* (2013.01);
  (Continued)

(58) Field of Classification Search
  None
  See application file for complete search history.

(56) References Cited

U.S. PATENT DOCUMENTS 7,898,238 B2   3/2011  Wiedemuth et al.
8,872,427 B2 * 10/2014  Itomura ................ C23C 16/26
                                                 315/111.01

(Continued)

FOREIGN PATENT DOCUMENTS

DE   3337811 A1   5/1985
DE   3942560 C2   5/1996
(Continued)

OTHER PUBLICATIONS

John R. Hollahan and Alexis T. Bell: "Techniques and Applications of Plasma Chemistry", published by John Wiley & Sons, Inc. (1974), pp. 393-399.

(Continued)

*Primary Examiner* — Dedei K Hammond
(74) *Attorney, Agent, or Firm* — Fitch, Even, Tabin & Flannery LLP

(57) ABSTRACT

A circuit assembly (12) includes a direct voltage supply (13) providing a direct voltage (Ucc), a step-up converter circuit (16), and a control unit (17). The step-up converter circuit (16) contains a series circuit consisting of an inductor (18) and a controllable switch (19), wherein the inductor (18) is connected between a pole (21) of the direct voltage supply (13) and a first electrode (D) of the switch (19). The control unit (17) controls the switch (19) with a high-frequency to generate high-frequency energy with a periodic pulse-like output voltage (UDS) at the first electrode (D) of the switch (19), said output voltage having a peak value larger than the value of the direct voltage (Ucc). The high-frequency energy is directly output without transformation at an output connection (24) designed to directly connect to an electrode (8) of the vacuum chamber (2).

21 Claims, 8 Drawing Sheets

(51) Int. Cl.
  *H05H 1/46* (2006.01)
  *H02M 7/48* (2007.01)
(52) U.S. Cl.
  CPC ............... *H02M 7/48* (2013.01); *H05H 1/46* (2013.01); *H01J 2237/335* (2013.01); *H05H 2001/466* (2013.01); *H05H 2001/4682* (2013.01)

(56) References Cited

U.S. PATENT DOCUMENTS

| | | |
|---|---|---|
| 2005/0242788 A1 | 11/2005 | Reithmaier |
| 2006/0196426 A1 | 9/2006 | Gluck et al. |
| 2014/0117861 A1* | 5/2014 | Finley ..................... H05H 1/46 315/172 |
| 2014/0346949 A1 | 11/2014 | Back |
| 2015/0282290 A1 | 10/2015 | Borowy et al. |
| 2016/0287735 A1 | 10/2016 | Diener |

FOREIGN PATENT DOCUMENTS

| | | |
|---|---|---|
| DE | 10312549 B3 | 8/2004 |
| DE | 102011083668 A1 | 4/2013 |
| DE | 102013226814 A1 | 6/2015 |
| EP | 1592117 A1 | 11/2005 |
| EP | 1701376 A1 | 9/2006 |
| WO | 2006023847 A1 | 3/2006 |

OTHER PUBLICATIONS

International Search Report and Written Opinion, dated Jul. 11, 2017 for International Application No. PCT/EP2017/060597 (11 pgs.).

German Office Action dated Apr. 24, 2017, for German Application No. 102016109343.2 (16 pgs.).

* cited by examiner

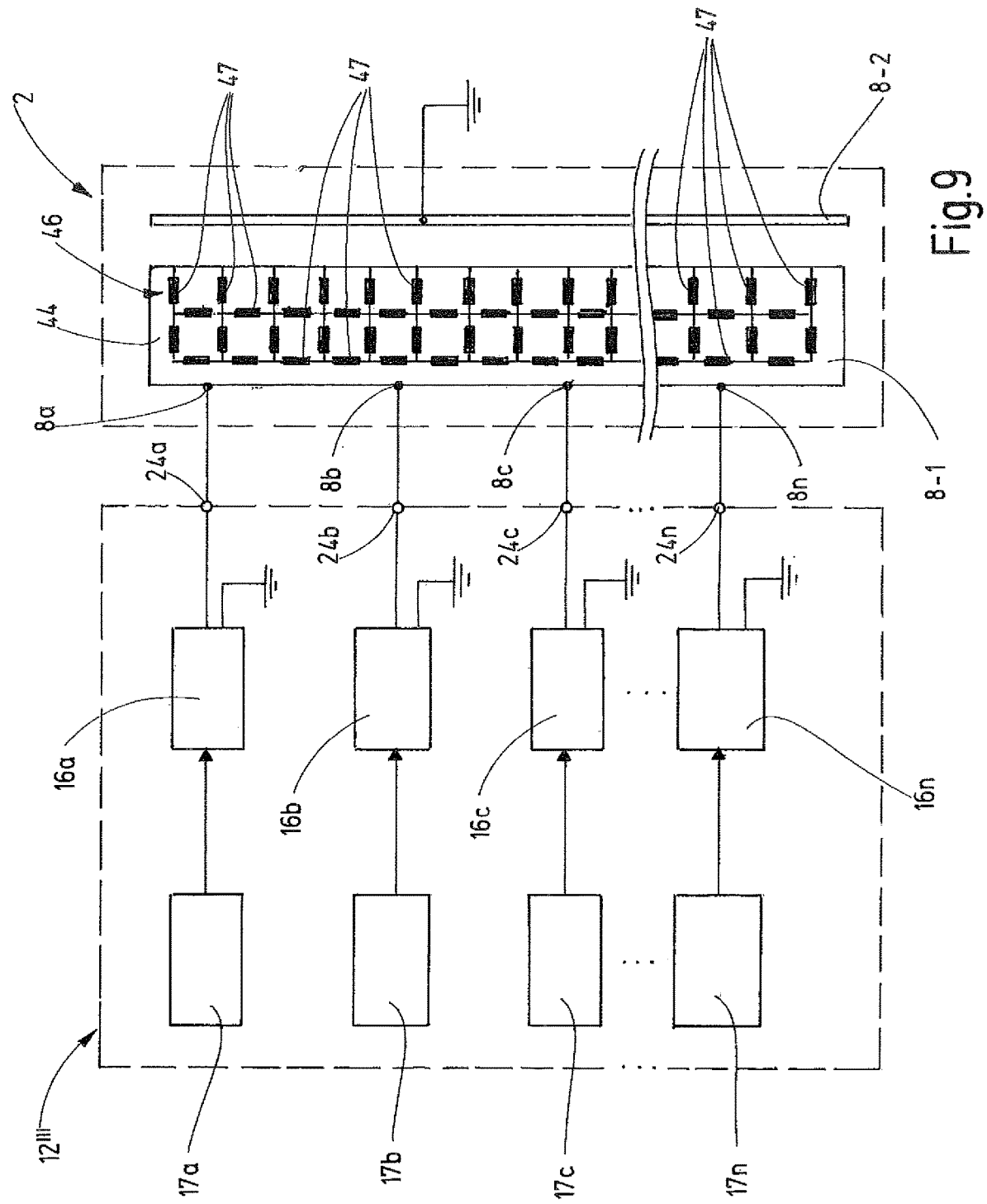

CIRCUIT ASSEMBLY FOR PROVIDING HIGH-FREQUENCY ENERGY, AND SYSTEM FOR GENERATING AN ELECTRIC DISCHARGE

CROSS REFERENCE TO RELATED APPLICATIONS

This patent application is the national phase of PCT/EP2017/060597 filed May 4, 2017.

TECHNICAL FIELD

The invention relates to a circuit assembly for providing high-frequency energy in order to generate an electric discharge in a vacuum chamber, and a system for generating an electric discharge. In particular, the invention relates to a circuit assembly for providing high-frequency energy in order to generate plasma, and a low-pressure plasma system.

BACKGROUND

Low-pressure plasma systems, which work with plasma excitation frequencies of more than 1 MHz in the high-frequency (HF) range that is relevant here, are used, e.g., for cleaning or activating objects made of metal, plastic, glass, and ceramic before further processing, such as, for example, before sputtering, spray painting, cementing, printing, soldering, etc., for etching or coating by means of plasma, for plasma generation for gas lasers, e.g., $CO_2$ lasers, and for many other applications.

John R. Hollahan and Alexis T. Bell: "Techniques and Applications of Plasma Chemistry", published by John Wiley & Sons, Inc. (1974), pp. 393-399, describe a widely used conventional low-pressure plasma system. This low-pressure plasma system contains a vacuum chamber to hold a medium or process gas to be ionized, a vacuum pump to produce a vacuum in the chamber, a high frequency generator, and means to apply a high frequency field to the vacuum chamber and an impedance matching network. It can possibly also contain means to measure the HF power supplied to the vacuum chamber and/or means to measure its pressure.

The high frequency (HF) generator supplies the HF power required for generating the plasma, said HF power having values between, e.g., 10 W and a few kW at the high operating frequency. This high frequency generator must meet the regulations relating to the usable high frequency bands, in particular the frequencies of 6.78 MHz, 13.56 MHz, 27.12 MHz, or 40.68 MHz that are allocated for industry, science and medicine (ISM), and it must be able to operate with an output impedance of 50 ohms. Such an HF generator generally contains a crystal-controlled HF oscillator, which usually works with an LC oscillating circuit or as a feedback oscillator at a resonant frequency that corresponds to the desired ISM frequency, and serves as a source for the HF signal. The HF generator also has an amplifier, which amplifies the signal from the oscillator, and an output stage that is designed to provide a desired output power and a fixed output impedance of the HF generator. As a rule, this is accomplished by providing a circuit consisting of coils and capacitors with fixed inductance and capacitance values, which transforms the impedance at the output of the amplifier into the desired output impedance of the HF generator, e.g., 50 ohms. The HF power signal generated by the HF generator is transferred through leads and applied to electrodes of the vacuum chamber to excite the process gas therein, to cause an electric discharge, and in this way to generate a plasma.

The impedance matching network, which is also called a matching unit, is connected between the HF generator and the vacuum chamber and serves to match the impedance of the generator and that of the load, in particular the plasma chamber with the plasma located therein. If the impedance is well matched, power from the generator can be transferred with high efficiency until the discharge in the vacuum chamber. By contrast, if the impedance is mismatched, there are reflections in the lead between the HF generator and the load, which have the consequence of power losses. Impedance matching circuits are often based on an L, T, or Pi type arrangement of coils and capacitors, which are to be suitably dimensioned.

In a low-pressure plasma system, the load impedance depends on numerous factors and is variable. For example, the impedance depends on the geometric shape of the vacuum chamber and the arrangement of the electrodes in the vacuum chamber. The type of the ionizable medium or process gas used, the pressure and the temperature in the vacuum chamber, and the supplied power also affect the impedance. The impedance changes suddenly on ignition, and also does not remain constant in operation. The line impedance of the lead between the HF generator, which is frequently remotely located, and the vacuum chamber must also be taken into consideration. Therefore, low-pressure plasma systems typically use variable impedance matching networks, whose coils and capacitors have variable inductance and capacitance values and are adjustable, to transform a load impedance into the 50 ohm output impedance that is typical of an HF generator. However, suitable and optimal adjustment of the coils and capacitors to match the impedance is laborious and time-consuming, depends greatly on the experience of the operator, and is hardly reproducible. Frequently, the power output by the HF generator is compared with the power measured at the vacuum chamber, and the coils and capacitors are adjusted by testing, to match the powers. Without correct matching, there can be difficulties when the process gas breaks down in the vacuum chamber. In rare cases, after ignition the plasma can be extinguished again, due to a decrease in impedance. Optimal impedance matching can represent an extremely challenging and laborious procedure, even for experienced specialized personnel.

DE 39 42 560 C2 describes a high frequency generator for a plasma-generating consumer with a direct voltage energy source and a high-frequency actuated electronic switch, wherein the plasma-generating consumer is connected directly between the energy source and the switch, without interposition of an impedance matching network. The switch is actuated by a square wave HF control signal, alternately turning on and off the output voltage of the energy source, and this output voltage is applied directly to the plasma-generating consumer as an operating voltage. To allow the square wave voltage to be transferred, this HF generator deliberately does without inductors and capacitors between the energy source and the terminals of the generator. Moreover, at supply voltages of some hundred volts, the MOSFET must be able to switch high currents on the order of 10 amperes or more in a few nanoseconds, and it must have low self-inductance. Therefore, special fast switching power MOSFET transistors are used here, which have internal connections each of which is connected in an inductance-reducing manner with external connections of the housing of the MOSFET transistor through multiple bond wires, the housing having two gate-side source connections and two drain-side source connections and each of the connections of the housing having a so-called stripline structure, i.e., being realized outwardly flat and closely adjacent. Such fast switching power MOSFET transistors are absolutely necessary in this circuit topology, however they are relatively large in size, are very costly, and require a correspondingly complex circuit environment and especially cleverly thought-out, fast, and costly gate control units (gate drivers). It is desirable to use switches and associated drive units that are relatively commercially available and economical even for HF low-pressure plasma applications.

DE 33 37 811 A1 discloses a high frequency generator that has a direct voltage energy source whose output is connected with a controllable electronic switch. The direct voltage that is turned on and off by the switch is fed to an energy buffer and transfer device in the form of a transformer, whose output is connected with a low-temperature plasma generator. The electronic switch is controlled in a pulse-like manner by a control circuit, producing, at the output of the transformer, a high-voltage output pulse to operate the plasma generator. This generator cannot generate high-frequency high-voltage pulses, i.e., pulses in the MHz range, since at such input frequencies the transformer can no longer transfer or generate high-voltage pulses with such frequencies at its output as a consequence of its ohmic and inductive and capacitive resistance. Moreover, here the switch, a MOSFET, is connected between the energy source and the transformer, so that the source potential forms a floating reference potential for the gate terminal and the control circuit connected to it. Therefore, here especially low-capacitance power supply is required, to avoid high switching losses, EMC problems, and possible malfunctions. This additionally makes this generator unsuitable for use in HF low-pressure plasma systems.

SUMMARY

Starting from this, it is an object of the invention to create a circuit assembly for providing high-frequency energy in the MHz range in order to generate an electric discharge in a vacuum chamber and a system for generating an electric discharge, that overcome the above-described disadvantages of the prior art. In particular, it is an object of the invention to create such a circuit assembly and such a system, that have a small number of simple, economical components, that require no costly HF POWER MOSFET transistors or associated control units, and that manage without an impedance matching network or output voltage transformation. The invention should also facilitate commissioning and handling in operation and allow high operational efficiency and operational reliability.

These objects are achieved with a circuit assembly for providing high-frequency energy, and by a system for generating an electric discharge.

One aspect of the invention creates a circuit assembly for providing high-frequency energy in order to generate an electric discharge in a vacuum chamber, in particular in order to generate plasma. The circuit assembly comprises a direct voltage supply that provides a direct voltage. The circuit assembly also comprises a step-up converter circuit that contains a series circuit consisting of an inductor and a controllable switch. The inductor is connected between a pole of the direct voltage supply and a first electrode of the switch, a second electrode of the switch being connected to ground, and the switch additionally having a control electrode. The circuit assembly also comprises a control unit that is configured to control the switch with a high-frequency in order to generate, at the first electrode of the switch, high-frequency energy with a periodic pulse-like output voltage whose peak value is larger than the value of the direct voltage of the direct voltage supply. The circuit assembly also comprises an output connection that is intended for direct connection to an electrode of the vacuum chamber, without interposition of an impedance matching network and without voltage transformation means, and that is directly connected to the first electrode of the switch, to apply the high-frequency energy with the output voltage directly to the vacuum chamber.

The inventive circuit assembly makes available a novel HF generator that is based on a topology and mode of operation of a step-up converter. The inductor is designed to be strongly magnetized as the switch is closed and to be demagnetized again as the switch is opened, to discharge it to the output connection. This allows the step-up converter to provide, to the output connection and to a vacuum chamber directly connected to it, a high current and a high voltage which is set up as the switch is closed, allowing HF powers in the kW range. It is advantageously possible to omit a conventional HF generator and an impedance matching network (a matching unit) to match the load impedance to the output impedance of the HF generator. Instead, the HF power generated by the step-up converter circuit is applied directly to the output connection and the vacuum chamber, without impedance matching and without further transformation.

The inventive circuit assembly is free of a resonant circuit made of discrete components, such as coils and capacitors, or formed by feedback, which is provided in conventional systems, for example low-pressure plasma systems, to generate an HF alternating voltage. The inventive circuit assembly has no such resonant circuit. The inventive circuit assembly is also free of coils and capacitors that serve to create a defined output impedance at the output connection. To accomplish this, conventional systems require additional circuits with coils and capacitors, which match the output power of a conventional HF generator to the 50 ohm output impedance for transfer. The inventive circuit assembly is also free of a matching unit, such as is conventionally arranged between the HF generator and the load. The direct application of the output power for direct generation of plasma without transformation mean that temperature, pressure, type of gas, corrosion, etc., have hardly any influence on an impedance mismatch. Moreover, it is possible to achieve very good efficiency in the path of the HF power. In addition, eliminating the matching unit and leads reduces losses. The invention is able to achieve relatively high efficiencies of about 70 to 85%. The simplified structure also makes it possible to save raw materials and components, above all expensive variable components, and the associated costs. Elaborate adjustment work by specialized operators is not required. It is possible to achieve high reliability and possibly redundancy in operation.

The inventive circuit assembly is suitable for diverse applications. In a preferred application, it is designed for operation in low-pressure plasma systems that have a plasma chamber with a working pressure that is less than atmospheric pressure, preferably about 0.01 mbar to 200 mbar, more preferably 0.01 mbar to 5 mbar, especially preferably about 0.05 mbar to 2 mbar. Such low-pressure plasma systems are most suitable for cleaning or activating work pieces before further processing, for example by bonding, printing, soldering, etc., or for coating or etching of materials. The circuit assembly could also be used in connection with gas lasers to couple high-frequency energy into them.

In the preferred application for low-pressure plasma systems, the direct voltage can preferably lie in the range from 0 to 400 V. The output voltage that is generated by the step-up converter circuit can be more than 350 V or can even lie in the range from 400 V to 900 V, possibly up to 1,500 V or higher. The control frequency and the frequency of the output voltage correspond to one of the ISM frequencies $f_{ISM}$ of 6.78 MHz, 13.56 MHz, 27.12 MHz, or 40.68 MHz. Preferably, it is 13.56 MHz.

The circuit assembly does without an LC oscillator and without a feedback oscillator. In order to support the periodic operation and to create the quasi-resonant step-up converter, the inductor can preferably be especially selected so that when combined with the capacitive component of the impedance of the vacuum chamber, it produces from the inductor and the capacitive component of the impedance of the vacuum chamber a resonant frequency of a quasi-oscillating circuit that lies in the range from $0.5 \times f_{ISM}$ to $1.5 f_{ISM}$, preferably in the range from $0.9 \times f_{ISM}$ to $1.4 \times f_{ISM}$, where $f_{ISM}$ is the desired control frequency or the frequency of the output voltage, for example 13.56 MHz. The impedance of the vacuum chamber is determined by, among other things, the structure and geometric arrangement of the vacuum chamber, its electrodes, the parasitic capacitances to ground of the switch and of a circuit board supporting the circuit assembly, and can be calculated or be empirically determined. Taking into consideration the capacitance of the electrodes of the vacuum chamber in each case when dimensioning the inductor in fact makes these electrodes an integral part of the circuit assembly. Such dimensioning of the inductor allows relatively high output voltage pulses to be periodically produced at the first electrode of the switch of the step-up converter and to be fed, together with a periodic alternating current, directly into the vacuum chamber in the form of HF energy. Suitable time control allows the switch to be turned on loss-free at the zero crossing of the voltage, reducing power losses.

The controllable switch used for the circuit assembly is preferably a power semiconductor switch, especially a bipolar transistor, or also an electron tube. Preferably, economical conventional power MOSFETs are used. Fast switching low self-inductance high-frequency power MOSFET transistors with associated elaborate housings, such as, for example, those described above in connection with DE 39 42 560 C2, are not required here.

In particular, the controllable switch can be a semiconductor transistor with an input capacitance that is less than 5 nF, preferably less than 1 nF. Then, the input capacitance corresponding to the operating frequency can be recharged sufficiently quickly. The controllable switch also preferably has a reverse voltage that is greater than 500 V, preferably greater than 900 V. This makes it possible to generate the high HF alternating voltages with peak values above 400 $V_{peak}$, possibly up to 900 $V_{peak}$, without there being danger of damage to the switch. The controllable switch preferably also has rise times and fall times that are less than 15 ns, to satisfy the high frequency requirements. Silicon carbide power MOSFETs can advantageously meet these requirements, and are preferably used. However, it is also possible to use, e.g., gallium nitride power MOSFETs or other semiconductor switches that are currently known or that will be developed in the future, or other controllable switches that meet these requirements, in particular with respect to the high reverse voltages.

The low input capacitance that the switch must recharge to switch over advantageously allows the control unit for the switch, e.g., a gate driver for a MOSFET switch, to be configured to control the switch with a relatively small actuation current or drive current of less than 10 A, preferably even less than 5 A, especially preferably even less than 2 A. That is, it is possible to use small, economical control units or drivers, which are commercially available in the form of integrated circuits with a relatively simple, space-saving housing. For example, it is possible to use inexpensive TO-247 semiconductor housings.

To control the operation of the circuit assembly, a controller is preferably provided. This controller can be arranged, in the form of a microprocessor or something similar, on a common circuit board with the step-up converter circuit and the control unit, or it can be arranged on a separate circuit board. The controller could also be part of a computer, of a workstation, or of something similar, that is in communication with the circuit assembly.

In a preferred embodiment, the controller is preferably configured to provide a normal operation mode and an ignition operation mode that is different from the normal operation mode. In particular, the circuit assembly can be configured so that in the ignition operation mode it generates an output voltage that is larger than it is in the normal operation mode, preferably at least 10% larger than the mean of the output voltage in the normal operation mode. The higher output voltage takes into account the higher impedance of the medium to be ionized before ignition and helps to allow reliable ignition by increasing the HF power input. In normal operation it is then possible to reduce the coupled HF power. The increase in the output voltage for the ignition operation mode can be achieved by increasing the input voltage from, e.g., 100 V in normal operation to 150 V in the ignition operation mode.

In an advantageous implementation, the controller is configured to periodically cause the ignition operation mode with a frequency that is clearly lower than the operating high frequency in ongoing operation. For example, this frequency can be about 100 Hz. Thus, no adjustment or initiation of the ignition operation mode, e.g., by an operator, is required. Instead, the ignition operation mode is part of the continuous normal operation mode. Even if a plasma is accidentally extinguished, it may be directly and immediately ignited again.

In preferred embodiments, the circuit assembly has two or preferably more step-up converter circuits connected to a common direct voltage supply with associated inductor, associated controllable switch, and with associated individual output connections to couple high-frequency energy to separate electrodes of a vacuum chamber and a number of control units associated with the switches. Each control unit can be associated with one or also two step-up converter circuits, if it can manage this. This can further reduce the number of components and the space required for the circuit assembly.

The circuit assembly can have a clock generator unit which supplies a timing clock signal to all control units that are present so that they are operated largely synchronously. In particular, it can be provided that the control units be synchronously operated within a maximum phase shift of 10%, preferably less than 2%. If the step-up converter circuits supply various electrodes of the vacuum chamber that are arranged distributed over the vacuum chamber, this makes it possible to achieve a largely synchronous, in-phase excitation and to obtain a homogeneous plasma in the entire plasma chamber.

The inventive circuit assembly is characterized by high safety and reliability. It is inherently short-circuit-proof, since the switch of the step-up converter circuit does not lie in the current path if there is a short circuit in the vacuum chamber, and only a small intermediate circuit capacitance is required. Moreover, the distributed power components work at a relatively low temperature level. The circuit assembly preferably also has, upstream of all switches of the step-up converter circuits, a common overcurrent protection device which interrupts the power supply permanently or for a defined period of time if the current consumption of the entire circuit reaches a determinable level. This can protect the components of the circuit assembly and the circuit board as a whole. This can be extremely important, e.g., if there are unexpected short circuits in the chamber, which can be caused, for example, by treated objects falling over.

Additionally or alternatively, the circuit assembly can have an overvoltage protection device, which is set up to eliminate an overvoltage that might occur. Preferably, it is possible to provide, at the output of each switch of the step-up converter circuit, a discharge path, e.g., a so-called switching spark gap, which automatically triggers or is triggered in the case of an overvoltage.

The protective devices for the circuit assembly can also optionally include an over-temperature protection device. If there is an over-temperature, it is possible, as in other cases, for the circuit assembly to be briefly or permanently turned off and/or for an alarm for an operator to be output.

Another aspect of the invention is a system for generating an electrical discharge, in particular a low-pressure plasma system. The system comprises a vacuum chamber, in particular a plasma chamber, to hold an ionizable medium, the vacuum chamber containing a number of electrodes to couple high-frequency energy into the ionizable medium inductively, capacitively, or directly, in order to ionize the medium. The system also comprises a circuit assembly to provide high-frequency energy, as described above. Every output connection of the circuit assembly is directly connected with an electrode of the vacuum chamber, without interposition of an impedance matching network.

This makes it possible to create a system, in particular a low-pressure plasma system, that benefits from the advantageous construction of the inventive circuit assembly, whose advantages also benefit the entire system. The resulting system is simply built, compact and economical. It does without a conventional HF generator, without an impedance matching unit arranged between the HF generator and the vacuum chamber, without interposed voltage transformation means, and without costly HF power MOSFET transistors and associated HF drivers. In particular, the system can be reliably turned on and operated, and ignition can safely be performed to generate and stably maintain a plasma. Here no mismatch occurs due to temperature, pressure, gas type, operator error, corrosion of contacts, electrodes and leads, such as occurs in conventional systems. The very small dimensions of the generator segments and short commutation paths can keep EMC emissions low. Moreover, line losses are reduced, so that the entire system can achieve high efficiency. Elimination of the impedance matching unit, the leads, and the conventional plasma generator can avoid expensive variable components, raw materials, and adjustment work that has to be done by specialists.

In preferred embodiments of the inventive system, the circuit assembly is implemented on one or more circuit boards, which is or are arranged in the immediate vicinity of the vacuum chamber and preferably received in a common housing with it. It is especially preferable for the at least one circuit board to be in direct contact with the chamber or its electrodes. For example, output connections of the circuit board can have a direct plug-in or threaded connection with electrode connections of the vacuum chamber. Then, no connection cables, or only relatively short ones are required between the circuit board and the electrode connections of the vacuum chamber. In any case, the line impedance can be neglected. This line impedance cannot cause any substantial mismatch between the output impedance of the step-up converter circuit and the vacuum chamber, or any reflections or power losses associated with such a mismatch.

The at least one circuit board can advantageously be arranged in such spatial proximity to the vacuum chamber that the electrical connection path between the first electrode of every controllable switch of the circuit assembly and the associated electrode of the vacuum chamber is shorter than 100 cm, preferably shorter than 20 cm, especially preferably shorter than 12 cm.

Additionally or alternatively, the inductance of the connection path between the first electrode of every controllable switch of the circuit assembly and the associated electrode of the vacuum chamber can be less than 10 pH, preferably less than 1 pH, especially preferably less than 250 nH. Such a short connection path or low inductance of the connection path avoids an impedance mismatch or wave reflections on the connection path, with the associated power losses.

In certain embodiments of the invention, the vacuum chamber can be a glass chamber, which has a chamber wall made of glass, preferably quartz glass or borosilicate glass, that surrounds the interior of the vacuum chamber. The electrodes of the vacuum chamber can be arranged, e.g., in the form of spiral coils or capacitor electrodes on the outer surface of the chamber wall. Preferably, multiple such electrodes are provided, which are uniformly distributed, equidistant from one another in a longitudinal direction of the vacuum chamber, to achieve homogeneous energy coupling over the vacuum chamber and thereby to obtain a homogeneous plasma. Every electrode of the vacuum chamber is associated with a step-up converter circuit of the circuit assembly.

In one special embodiment, each switch of the circuit assembly can have a thermally conductive connection with the associated electrode. For example, the switch can be arranged directly on the associated spiral coil or planar capacitor electrode, possibly with an interposed electrically insulating layer, or it can be indirectly connected with the associated spiral coil or planar capacitor electrode. In any case, the electrode of the vacuum chamber then simultaneously also serves as a heat sink for the switch, in particular for the power semiconductor switch, so that the heat that develops in operation of this switch can be conducted away from it in an effective manner.

In other embodiments, the vacuum chamber can be a metal chamber, which has a chamber wall made of metal, preferably aluminum or stainless steel, which surrounds the interior of the vacuum chamber. The electrodes of vacuum chamber then project into the interior of the vacuum chamber, it also being preferable for multiple such electrodes to be provided, which are uniformly distributed, equidistant from one another in a longitudinal direction of the vacuum chamber. Every electrode is associated with a step-up converter circuit of the circuit assembly. To suppress a direct voltage component of the high frequency output voltage, a capacitor with a capacitance value of preferably 2 to 50 nF is provided between the electrode of the vacuum chamber and the associated switch of the circuit assembly.

In preferred embodiments that use a vacuum chamber made of metal, each switch of the circuit assembly can have a thermally conductive connection with the metal chamber wall. For example, the switches can be directly attached to the metal chamber wall through thermally conductive electrically insulating layers or washers, or indirectly connected to it through heat conductors, to dissipate heat to the chamber in operation.

The system can also contain multiple inventive circuit assemblies, each with multiple step-up converter circuits, control units, and output connections. The circuit assemblies can be distributed on a number of circuit boards which are connected to one another in parallel, each of which preferably being fed by its own direct voltage supply. All circuit boards and switches can be supplied with a common timing clock signal from a common clock generator. The lead connections can be routed so that the timing clock supplied to all control units is as synchronous as possible. In particular, the lead connections can include suitable time delay elements that support the synchronism of the timing clock that is supplied. Preferably, every circuit board has its own protection against overvoltage and/or overcurrent and/or over-temperature.

In other respects, further developments of the inventive system correspond to the above-mentioned embodiments of the inventive circuit assembly. To avoid repetition, it is referred to the above explanations of the embodiments of the circuit assembly and their advantages, which equally apply here for the entire system.

In an advantageous embodiment of the system, two or more output connections of the circuit assembly have an electrically conductive connection with one another, e.g., through a piece of sheet metal, to form a single common active electrode for the plasma chamber. This allows the circuit assembly to apply to the vacuum chamber a clearly higher cumulative HF power, which could even be 10 kW or more. Moreover, it allows a more homogeneous HF power to be fed in to a spatially extensive area of the vacuum chamber, and thus generate a more homogeneous plasma.

BRIEF DESCRIPTION OF THE DRAWINGS

Further advantageous details about embodiments of the invention follow from the subclaims, the drawing, and the associated description. The invention is described below in greater detail using a drawing, which shows exemplary embodiments of the invention that are not limiting in any way, the same reference numbers being used in all figures to designate the same elements. The figures are as follows:

FIG. 9 is a greatly simplified schematic diagram of a modified low-pressure plasma system with a circuit assembly to provide very high power high-frequency energy according to yet another embodiment of the invention.

DETAILED DESCRIPTION

Figure 1:
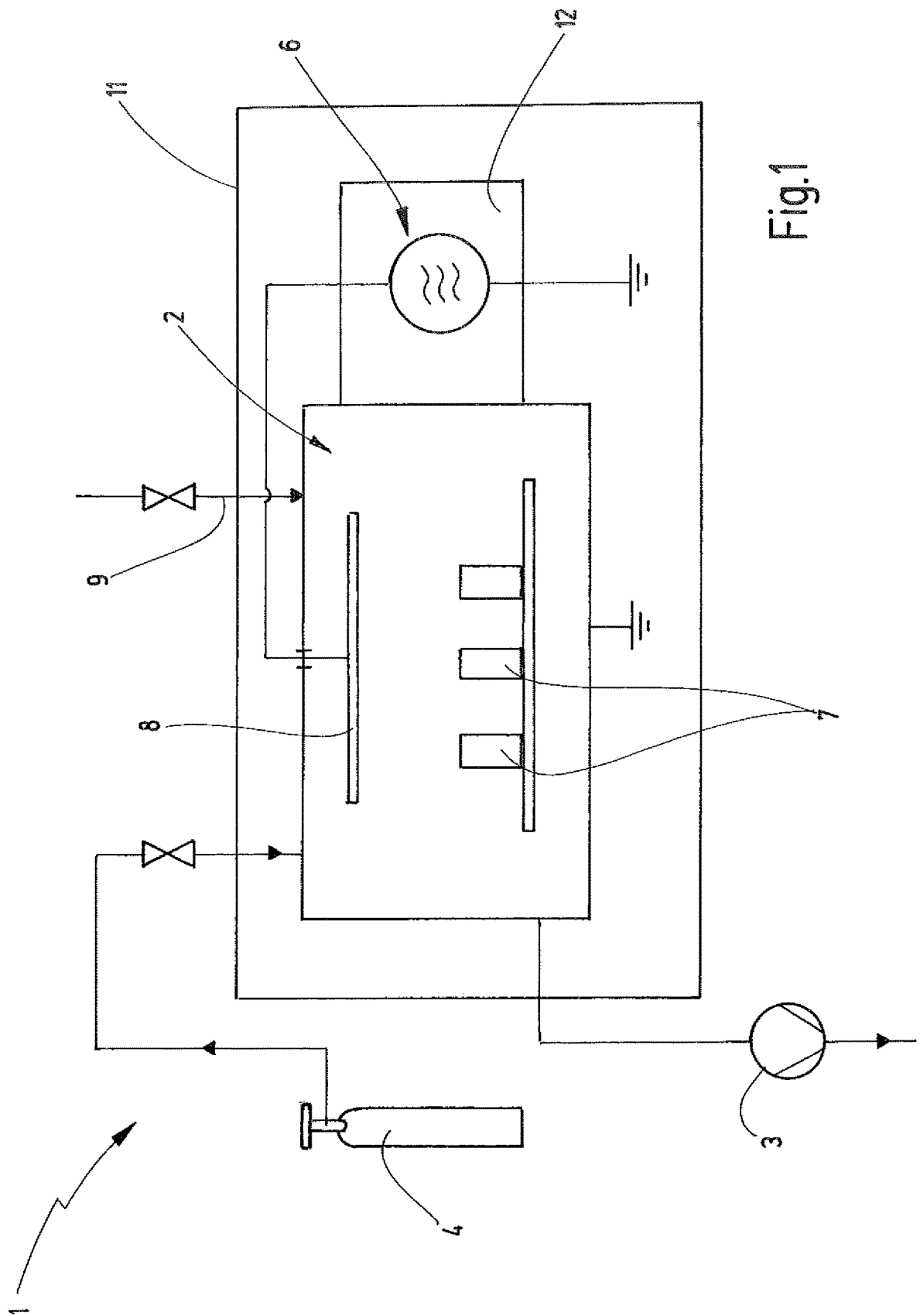
FIG. 1 is a highly schematic block diagram illustrating the principle of a low-pressure plasma system in which the invention can be used.

The discussion below will now refer to embodiments of the invention that are illustrated in the drawings. It should be understood that the embodiments illustrated in the drawings are only examples and do not limit the invention as such. Instead, the embodiments are only intended to explain possible embodiments of the invention and to enable the person skilled in the art to practice the invention. It should also be understood that in the effort to provide a concise description of possible embodiments, it might not be possible to indicate all details covered by the scope of the invention.

FIG. 1 is a greatly simplified block diagram showing a system 1 that here is, in particular, a low-pressure plasma system for treating objects. Such a system could be used, for example, for cleaning items made of metal, plastic, glass, or ceramic before further processing, for example, before sputtering, spray painting, bonding, printing, coating, soldering, etc., for activating items before further processing, for plasma etching, or for coating by means of plasma polymerization. However, it should be understood that the low-pressure plasma system shown in FIG. 1 only represents a preferred application of the invention, and that the invention could also be applied to other systems, e.g., gas laser systems.

With reference to FIG. 1, the low-pressure plasma system 1 contains a plasma chamber 2, also called a recipient, which holds an ionizable medium or process gas, a vacuum pump 3, a process gas source 4, and a high frequency (HF) generator 6. Here the vacuum chamber 2 is also generally referred to as a vacuum chamber, in order to cover all chambers into which the HF energy from an HF generator 6 is coupled, to generate an electric discharge inside the chamber.

For a plasma treatment process, an object 7 is placed inside the vacuum chamber 2, and a negative pressure is produced in the vacuum chamber 2 with the help of the vacuum pump 3. At an absolute pressure of about 0.1 millibar, the process gas, e.g., argon, oxygen, or something similar, or also ambient air is then introduced into the vacuum chamber 2 from the process gas source 4. The working pressure range is about 0.05 to 2.0 mbar. Once the working pressure is reached, the HF generator 6, which generates HF energy and is coupled into the interior of the vacuum chamber 2 through an electrode 8, is switched on to excite and to ionize the process gas and generate an electric discharge. A plasma is generated, to which the item to be treated is exposed. Fresh gas is continuously supplied to the plasma system, while gas consumed in the process is removed by means of the vacuum pump 3. After the treatment process, the vacuum chamber can be ventilated through an additional ventilation connection 9, after which the treated work pieces 7 can be removed from the chamber 2. So far, the structure and the mode of operation of the low-pressure plasma system 1 according to FIG. 1 correspond to those of a conventional low-pressure plasma system.

As can be seen from FIG. 1, the inventive HF generator 6 is arranged in the immediate vicinity of the plasma chamber 2. It can be housed in a common housing together with the plasma chamber 2, which is indicated in FIG. 1 by a rectangle 11. The immediate spatial proximity of the HF generator 6 to the plasma chamber 2 makes it possible to minimize the length of the lead to deliver HF energy to the electrode 8 of the plasma chamber 2, so that the electrode 8 is a quasi-integral part of the inventive HF generator 6 and is taken into consideration in its design. This, together with a novel inventive circuit assembly (explained in detail below) of the HF generator 6 forms the basis for making is possible here to omit an impedance matching network (a matching unit), such as is required in conventional systems, and for making is possible to supply the plasma chamber 2 with excitation signals of the high power and frequency required for stable plasma generation. The structure and operation of the system 1 can be simplified, which can reduce the cost of purchase and the operating costs.

Figure 2:
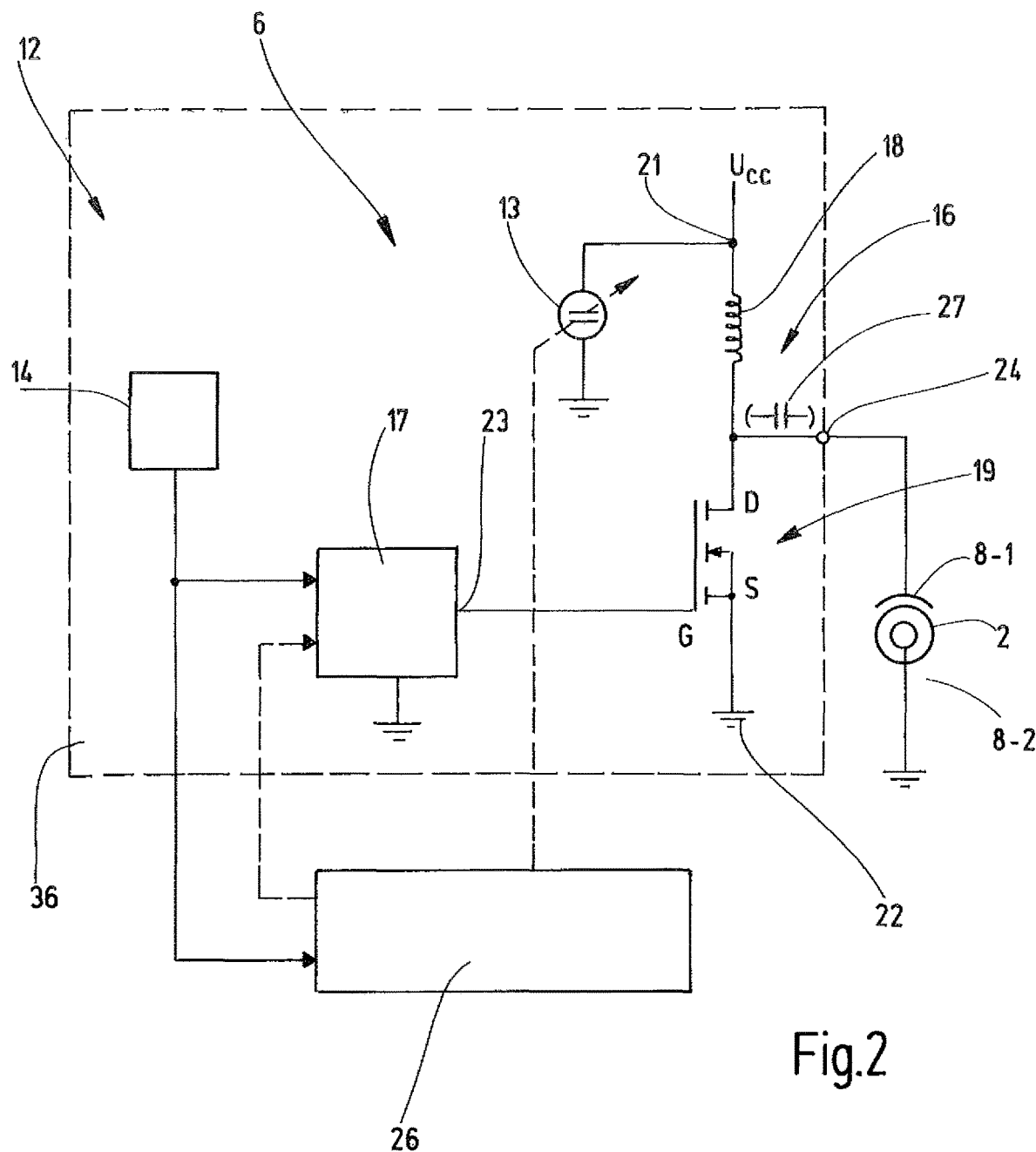
FIG. 2 is a greatly simplified representation of an exemplary embodiment of an inventive circuit assembly to provide high-frequency energy, for example, for the system according to FIG. 1.

FIG. 2 shows a greatly simplified topology of a first exemplary embodiment of a circuit assembly 12 for the inventive HF generator 6 for providing HF energy to generate an electric discharge in a vacuum chamber, e.g., the plasma chamber 2 according to FIG. 1. The circuit assembly 12 comprises a direct voltage supply 13, a clock generator unit 14, a step-up converter circuit 16, and a control unit 17 for the step-up converter circuit 16. The direct voltage supply 13 provides a (preferably continuous) direct voltage $U_{cc}$ to supply the circuit assembly 12. It is also possible for a pulsating direct voltage to be provided. The direct voltage $U_{cc}$ can be between 0 and 400 V, or it can be higher. The direct voltage $U_{cc}$ can be variable, as indicated by the dashed arrow.

The clock generator unit 14 provides a time pulse for the circuit assembly 12. In particular, the clock generator unit 14 can supply time pulses with a certain frequency that corresponds to one of the ISM frequencies of 6.78 MHz, 13.56 MHz, 27.12 MHz, and 40.68 MHz that are allocated for industry, science and medicine (ISM). It is preferable to use the frequency 13.56 MHz. However, it is understood that any operating high frequency could be used. The clock generator unit 14 can be an oscillator with a quartz crystal. The pulse duty ratio of the clock generator unit 14 can advantageously be fixed at less than 50%, for example between 30% and 50%, which might possibly reduce the input power.

The step-up converter circuit 16 is based on known step-up converter circuits, with a series circuit of an inductor 18 and a switch 19, which are directly connected with one another in series, between a first, here positive pole 21 of the direct voltage supply 13 and a ground 22. In particular, one terminal of the inductor 18 is connected with the positive pole 21, while the other terminal is connected with a drain electrode D of the switch 19, here in the form of an n-channel MOSFET. Here the source electrode S of the semiconductor switch 19 is directly connected with the ground 22. The source electrode S and the ground 22 could have a low-resistance shunt resistor (not shown) arranged between them, as is usual for current measurement. The switch 19 also has a control electrode or gate electrode G, which is connected with the output of the control unit 17.

Even though the switch S shown here is in the form of a MOSFET, in particular a power MOSFET, it is understood that other controllable power semiconductor switches can also be used for the switch 19 instead of the MOSFET, such as, for example, bipolar power transistors, if their switching can be clocked at a correspondingly high frequency. A person skilled in the art will recognize that although the discussion here refers to electrodes with drain D, source S, and gate G, it applies in the same way for electrodes of comparable semiconductor switches designated in other ways. In principle, the switch 19 could also be realized in the form of an electron tube, in which case the drain electrode D then corresponds to the anode of the electron tube and the source electrode S corresponds to its cathode. Here, preferred implementations preferably use a power MOSFET based on silicon carbide or gallium nitride, because of its especially suitable properties.

The control unit 17, also called a gate driver, receives time pulse signals from the clock generator unit 14, and on the basis of these time pulse signals it generates, at its output 23, which is connected with the gate electrode G of the switch 19, a control or drive signal that is suitable to turn on the switch 19. Generally speaking, a gate voltage of approximately 8-15 V is used to drive the switch 19 to turn it on. It is understood that when the switch 19 is turned on, it passes or conducts a current between the source electrode S and the drain electrode D, while when the switch 19 is turned off it interrupts or does not conduct a current flow from the drain electrode D to the source electrode S. Gate drivers 17 are commercially available, from numerous manufacturers, in the form of integrated circuits for different semiconductor switches.

As can also be seen from FIG. 2, the drain electrode D of the switch 19 is connected with an output connection 24 of the circuit assembly 12. The output connection 24 of the circuit assembly 12 supplies the HF energy required to operate the plasma chamber 2, this HF energy including an HF voltage and a high-frequency current. As is indicated in FIG. 2 and illustrated in FIG. 1, the output connection 24 is connected with the electrode 8-1 of the plasma chamber 2, to couple the HF energy into the chamber 2. Unlike the plasma chamber 2 in FIG. 1, here the plasma chamber 2 is not a metal chamber in which the electrode 8-1 projects into the interior of the plasma chamber 2, as illustrated in FIG. 1, but rather, for example, a glass chamber in which the electrodes 8-1, 8-2 are arranged on the outer surface of the chamber wall. In this case, the electrode 8-1 is associated with a counter electrode 8-2, which is connected with ground potential. It is understood that the metal plasma chamber 2 from FIG. 1 could also be used here. Moreover, instead of the electrodes 8-1, 8-2 being in the form of capacitor plates, it would be possible to use electrodes in the form of spiral coils that are wound around the chamber wall, to couple HF energy into the interior of the chamber through induction.

As can also be seen from FIG. 2, a controller 26 is provided to control the operation of the circuit assembly 12. The controller 26 can also be part of an overall controller that also controls the operation of the plasma chamber 2 or even of the entire low-pressure plasma system 1. The controller 26 can be in the form of hardware and/or firmware, which can be executed on a processor, for example. The hardware can be arranged on a common circuit board, together with the circuit assembly 12, or remote from it. In any case, the controller 26 here can control or regulate, for example, the direct voltage $U_{cc}$ of the direct voltage supply 13, control the control unit 17, receive time pulse signals from the clock generator unit 14, and preferably monitor parameters of the circuit assembly 12, in particular internal currents and voltages.

Figure 5:
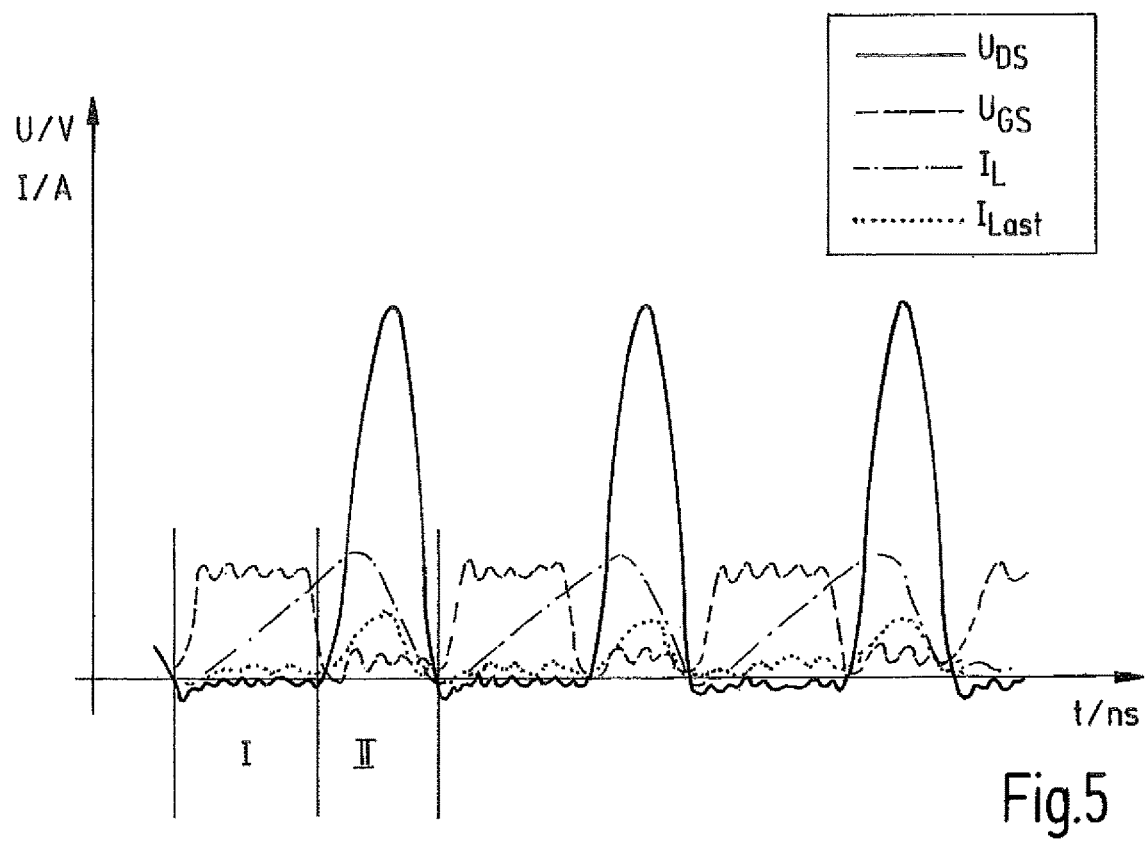
FIG. 5 is a simplified representation showing the time behavior of voltages and currents when the circuit assembly of the embodiment according to FIG. 2 is operated in the system according to FIG. 1.

The operation of the circuit assembly 12 for the HF generator 6 will now be described with reference to FIGS. 1 and 2 and additionally to FIG. 5, which illustrates the time behavior of voltages and currents in and on the circuit assembly 12. The circuit assembly 12 described so far operates as follows:

In time interval I of FIG. 5, the control unit 17 turns on the switch 19 by means of a control signal. To accomplish this, the control unit 17 sets the gate voltage $U_{GS}$ at the gate electrode G of the switch 19 from 0 V to, e.g., 12 V. The gate voltage $U_{GS}$ is illustrated in FIG. 5 by a dashed line. The drain voltage $U_{DS}$, which is illustrated in FIG. 5 with a solid line, lies at about 0 V when the switch 19 is switched through. When the switch 19 is turned on, the current through the inductor 18 begins to rise and magnetizes the inductor 18. The current flowing through the inductor 18 is represented in FIG. 5 with a dot-dash line. The load current draining from the drain electrode D of the switch 19 to the output connection 24 and flowing through the output connection 24 to the plasma chamber 2 as a load is represented in FIG. 5 with a dotted line. In time interval I, the load current is relatively small.

In time interval II, the switch 19 is turned off at first by the control unit 17. To accomplish this, the gate voltage $U_{GS}$ (dashed line) is reduced back to 0 V or to a negative value. After the gate voltage $U_{GS}$ has dropped and an associated signal propagation time has passed, the voltage $U_{DS}$ (solid line) at the drain electrode D of the switch 19 begins to rise. At the time when the value of the currently fed direct voltage $U_{cc}$, which here is, for example, 100 V, is exceeded, the inductor 18 discharges into the plasma chamber 2. In the process, the inductor 18 is demagnetized. The voltage $U_{DS}$ at the drain electrode D and directly on the plasma in the plasma chamber 2 reaches a peak value, which here is about 370 V, for example, and then drops off again. At this time, the load current $I_{load}$ (dotted line), which is part of the complex load of the plasma, will also reach its maximum, so that power is output to the plasma.

As can be seen from FIG. 5, the process in which the switch 19 is closed to magnetize the inductor 18, then the switch is opened to obtain a high drain voltage $U_{DS}$ and demagnetize the inductor 18 and have it discharge into the plasma chamber 2, periodically repeats with the frequency of, e.g., 13.56 MHz predetermined by the clock generator unit 14, to cause periodic excitation of the plasma in the plasma chamber 2 with the generated HF energy. As can be seen, this process corresponds to the typical mode of operation of a step-up converter, which here is used for HF excitation to generate plasma.

According to the invention, no LC oscillating circuit and no negative feedback oscillator are used to generate the periodic HF energy. However, instead there is an oscillating circuit, which is formed from the inductor 18 and the complex impedance, in particular the capacitive component of the impedance of the plasma chamber 2. This capacitive component of the impedance is determined above all by the structure and geometric arrangement of the plasma chamber 2 and its electrodes 8, 8-1, 8-2 and by the parasitic capacitances to ground of the switch 19 and a circuit board (not shown) supporting the circuit assembly 12. According to the invention, this oscillating circuit is used to allow especially advantageous, in particular low-loss operation of the switch 19. There is no impedance matching to adapt the impedance of the plasma chamber 2 to the 50 ohm conditions of an HF generator, as is required in conventional HF generators. Instead, here the complex, capacitive impedance of the plasma chamber 2 is part of the basic circuit of the circuit assembly 12 and is taken into consideration in the dimensioning. The impedance of the plasma chamber 2 can be computationally or empirically determined, taking into consideration the structural and geometric arrangement of the plasma chamber and the associated components. It is used for dimensioning of the inductor 18.

In particular, the inductor 18 should be selected so that in combination with the capacitance of the plasma chamber 2, depending on the individual geometric arrangement of the chamber 2 and in particular of the electrodes 8, 8-1, 8-2, the parasitic capacitances to ground of the switch 19 and the circuit board, etc., it generates a resonant frequency of the quasi-oscillating circuit that is as close as possible to 13.56 MHz or to the respective desired ISM frequency. The resonant frequency could deviate by a maximum of 50% from the optimal value. Preferably, it should be only minimally below the ISM frequency or only a little above it, preferably its maximum deviations from it should be −10% to +40%. Taking into consideration the respective capacitance between the electrodes 8, 8-1, 8-2 in dimensioning the inductor 18, practically makes them an integral component of the circuit assembly 12.

Preferably the inductor is also dimensioned so that the drain voltage $U_{DS}$ becomes zero immediately before the switch 19 is turned on, as can also be seen from FIG. 5. This allows the switch 19 to be turned on loss-free, giving the circuit 12 especially high efficiency and clearly reducing the warming of the semiconductor switch 19.

To make the inventive mode of operation possible, the controllable switch 19 should also meet certain criteria. For example, the switch 19 should have an input capacitance that is less than 5 nF, preferably less than 1 nF. Then, the input capacitance of the switch 19 can be recharged as quickly as required for these applications. At this operating frequency, the rise time and fall time of the switch 19 should preferably be less than 15 ns. The reverse voltage of the switch 19 should, if possible, be greater than 500 V, preferably greater than 900 V, to be able to generate high HF output voltages.

It has also been found that to achieve an economical and reliable structure of the circuit assembly 12 and to be able to do without impedance matching measures, the controllable switch 19 should be selected so that the ratio of the gate capacitance of the transistor to the drain current (at 25° C., for example) is less than 50 pF/A. If this is not taken into consideration, then at these high frequencies of, e.g., 13.56 MHz, the required driving power is so high that no drivers, or only extremely costly ones, are available for this. Moreover, the ratio of the driving power to the power transferred into the plasma also declines, lowering the efficiency of the arrangement. According to the invention, if the switch 19 and the gate driver 17 are correctly selected, it is possible to achieve a ratio of the driving power to the power transferred into the plasma of at least 1:15 to 1:20 or more. To accomplish this, the use of SiC or GaN power MOSFETs that have the previously mentioned properties is especially advantageous.

In order to obtain the desired high power from the entire circuit, that is in order to deliver high power output into the plasma with a high output voltage, the switch 19 should also preferably be selected so that the ratio of the gate capacitance to the reverse voltage of the switch is no higher than 0.5 pF/V and the reverse voltage is at least 900 V. The maximum possible output voltage of the circuit assembly 12 with switches having a maximum drain voltage $U_{DSmax}$ of 1,200 V (corresponding to a periodic peak voltage of 900 $V_{peak}$ in operation) must lie above the cold ignition voltage of the plasma. Although this ignition voltage depends on many parameters, among others the negative pressure in the plasma chamber, the gas composition, the geometry of the chamber and electrode, etc., this ignition voltage nevertheless usually lies over 400 V, and frequently over 800 V. For this reason, the switch should have a reverse voltage of at least 900 V.

Not only the switches, but also the gate drivers 17 must meet certain requirements. In particular, the gate drivers 17 should also have rise times and fall times that are less than 15 ns, preferably less than 10 ns, in order to be able to work at the frequency of 13.56 MHz. Furthermore, the gate drivers 17 should have a current carrying capacity that is sufficient for the applied gate capacitance.

Selecting and combining suitable inductors 18, power semiconductor switches 19 (or other switches, such as, for example, electron tubes), associated gate drivers 17 depending on the respective application and the respective geometry and structure of the plasma chamber 2 and its electrodes allows the inventive circuit assembly 12 for an HF generator 6 to do without special resonant circuits, without additional L,C components that match the output power of a conventional HF oscillator to the normally desired 50 ohm output impedance for transmission, and without adjustable components that match an impedance of the plasma chamber 2 to that of a conventional HF generator.

The controller 26 controls the operation of the circuit assembly 12. In particular, the controller can be designed to provide a normal operation mode and an ignition operation mode. As was already mentioned, the ignition voltage for the plasma can be over 400 V, possibly much higher, depending on various factors. For this reason, the controller can be designed so that in an ignition operation mode it generates, at the output connection 24 of the circuit assembly 12, an output voltage that is increased by a certain amount over that in the normal operation mode. The required amount of the increase in voltage for a certain plasma chamber 2 can be determined as a function of the respective parameters of the desired plasma treatment. In preferred embodiments, the output voltage in ignition operation mode is increased by at least 10% of the mean of the output voltage in the normal operation mode. The controller 26 can achieve this, e.g., by briefly increasing the supply voltage $U_{cc}$ of the direct voltage supply 13.

Figure 6:
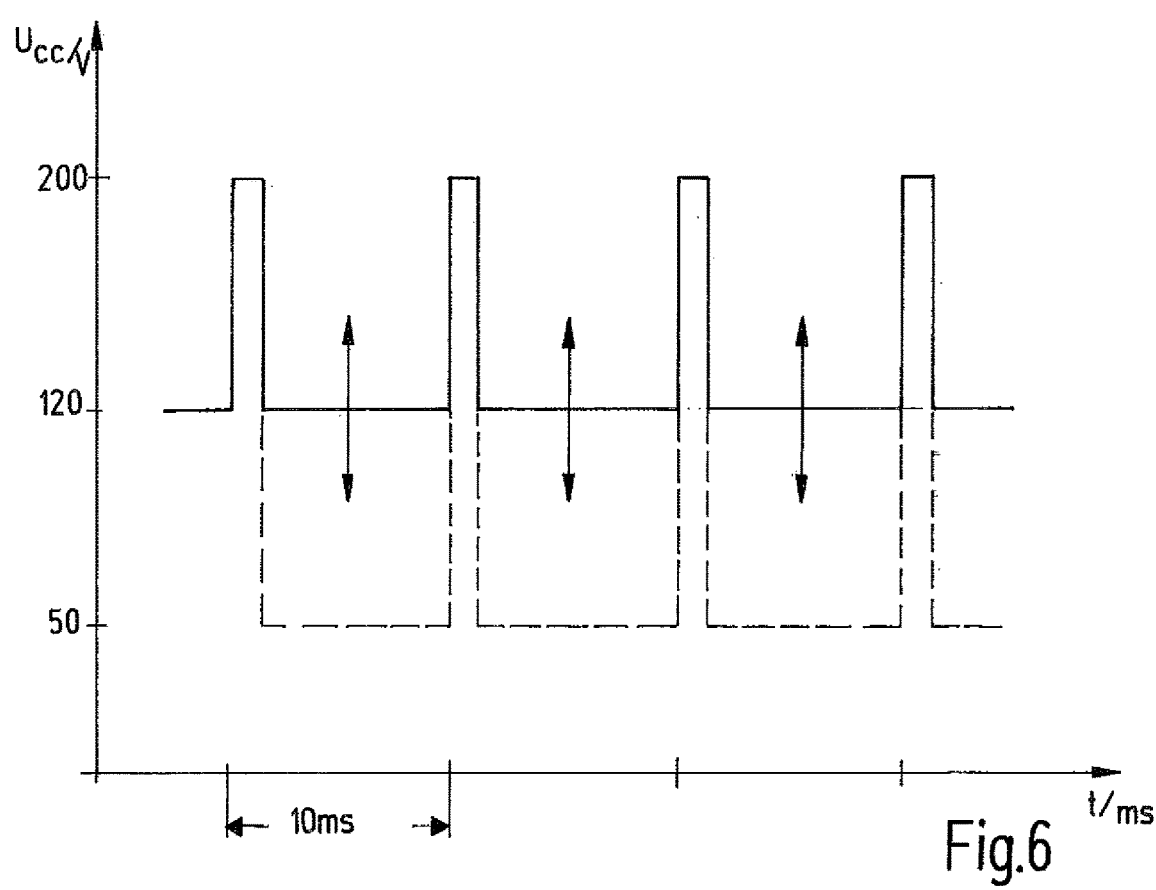
FIG. 6 is a greatly simplified representation of the time behavior of the supply voltage for the circuit assembly of the embodiment according to FIG. 2 to support ignition operation.

FIG. 6 shows an advantageous implementation in which no separate normal operation and ignition operation modes are provided; instead here they are simply interlaced in one another. As can be seen, at regular intervals, whose frequency is clearly less than the HF frequency of the output voltage to be generated, the supply voltage $U_{cc}$ is briefly raised from its normal operating level to a higher ignition level. The brief increase in voltage is selected so that it reliably causes ignition, or re-ignition, of the plasma in the plasma chamber 2 within a short time, without affecting the normal operation. As an example, the normal supply voltage $U_{cc}$ can be 120 V and is raised, e.g., to 200 V. The low frequency of the increase in voltage can be 200 Hz, which corresponds to a period of 10 ms, while the duration of the increase in voltage can be, for example 5-10% of the period, that is 0.5-1 ms here.

As FIG. 6 also shows by double arrows and dashed lines, the normal operating level of the supply voltage $U_{cc}$ can be varied, to control, by open-loop or closed-loop control, the power input into the circuit assembly 12.

Figure 3:
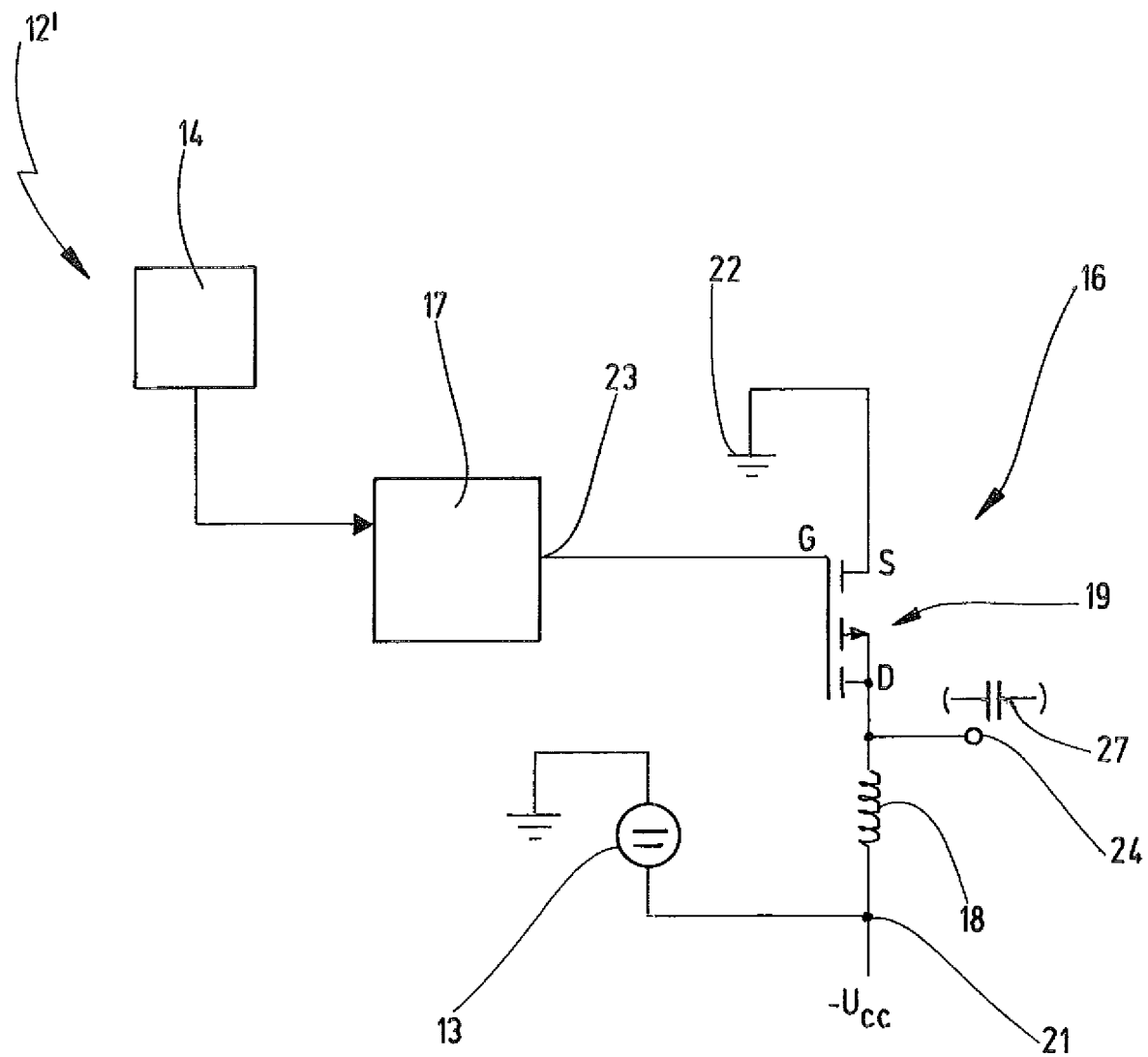
FIG. 3 is a greatly simplified representation of a modified circuit assembly to provide high-frequency energy, for example, for the system according to FIG. 1, according to another embodiment of the invention.

FIG. 3 shows a modified circuit topology of a circuit assembly 12' for an HF generator 6 for providing HF energy to generate an electric discharge in a vacuum chamber, such as, for example, the plasma chamber 2 according to FIG. 1. This circuit assembly 12' is similar to the circuit assembly 12 according to FIG. 2, so that if the structure and/or function correspond, the same reference numbers are used for the same elements in the circuit assembly 12' and, to avoid repetitions, it is referred to the description given above.

In contrast to the circuit assembly 12 according to FIG. 2, the circuit assembly 12' in FIG. 3 has a negative supply voltage $-U_{cc}$ and a p-channel MOSFET as switch 19. That is, the direct voltage supply 13 supplies, at its first pole 21, which here is negative with respect to the ground 22, a negative voltage $-U_{cc}$. The switch 19 is a p-channel MOSFET, which is once again connected in series with the inductor 18 between the ground 22 and the negative terminal 21.

In other respects, the structure and mode of operation of the circuit assembly 12' correspond to those of the circuit assembly 12 according to FIG. 2. When the switch 19 is turned on, a source-drain current flows through the switch 19 from the ground 22 to the negative pole 21 and magnetizes the inductor 18. If the switch is closed, the inductor 18 discharges and is demagnetized, a current continuing to flow, however decreasing, from the plasma chamber 2 (not shown) through the output connection 24 and the inductor 18 to the negative pole 21 of the direct voltage supply 13. It is understood that the p-channel MOSFET 19 in FIG. 3 is turned on with a negative gate-source voltage $U_{GS}$, and the voltage $U_{DS}$ at the drain electrode D or the output connection 24 of the circuit assembly 12' reaches a negative peak value in the turned off state of the switch 19.

As can be seen in FIGS. 2 and 3, a capacitor 27 can optionally be arranged between the drain connection D of the switch 19 and the output connection 24, to filter out the DC component in the load current supplied to or conducted away from the plasma chamber 2. This is important above all when a metal chamber 2 is used, as is illustrated in FIG. 1, where the electrode 8 is arranged in the interior of the chamber 2, so that a direct current could, without the capacitor 27, drain directly through the plasma as a short circuit current. Other components, in particular LC filters, could be arranged in the connection cable leading to the plasma chamber 2, before or after the output connection 24, to remove certain frequency ranges, e.g., harmonics, from the HF power signal that is generated. However, then such LC filters are only intended and designed for filtering the output signal, and are not dimensioned to generate a desired resonant frequency.

Figure 4:
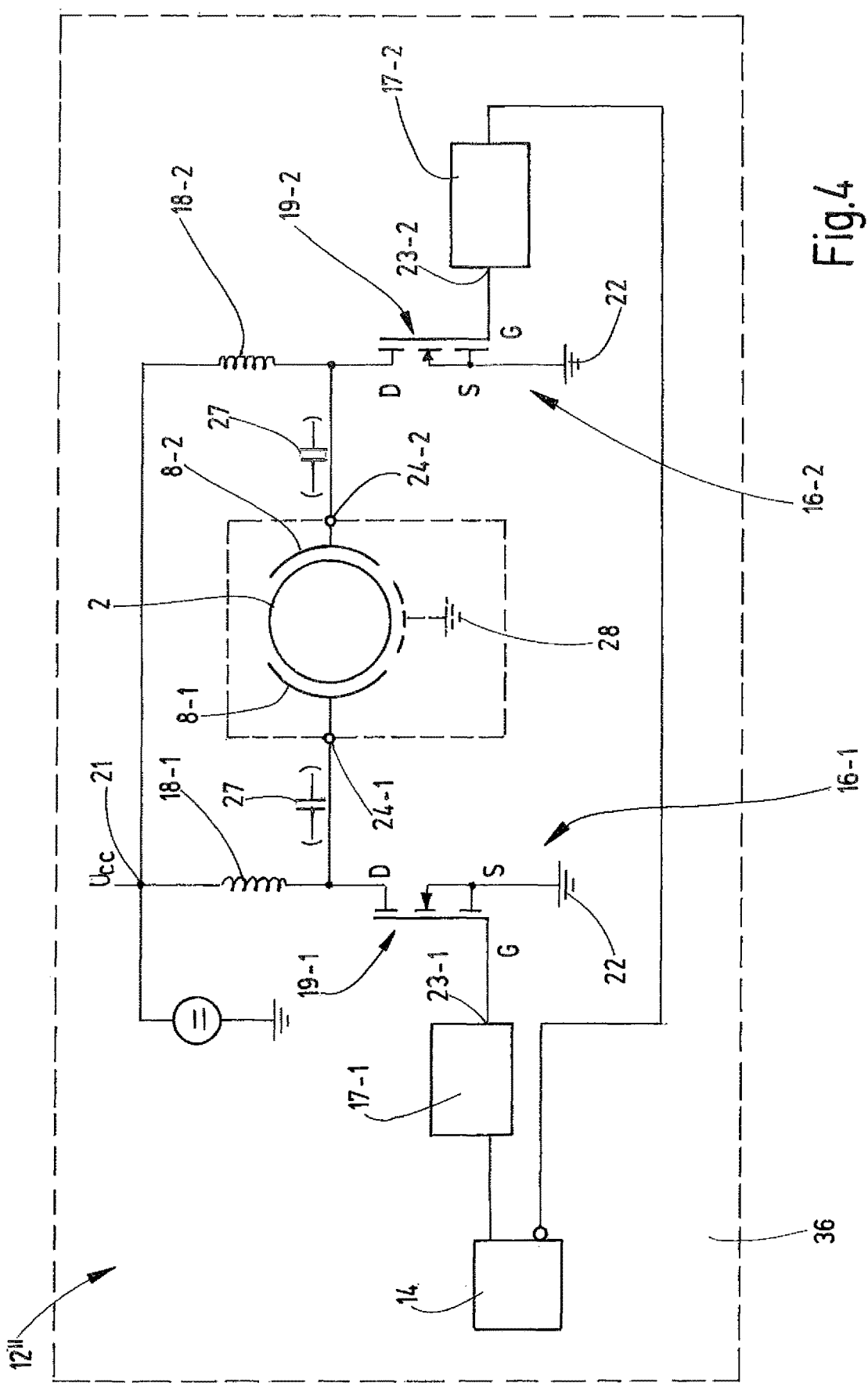
FIG. 4 is a greatly simplified representation of further modified circuit assembly to provide high-frequency energy, for example, for the system according to FIG. 1, according to another embodiment of the invention.

FIG. 4 shows a simplified representation of another circuit assembly 12" for providing high-frequency energy to generate an electric discharge in a vacuum chamber, in particular in the plasma chamber 2 according to FIG. 1. This circuit assembly 12" differs from that according to FIG. 2 in that two step-up converter circuits 16-1, 16-2 are provided here. The step-up converter circuits 16-1, 16-2 are identical, with a series circuit of an inductor 18-1 or 18-2 with associated switches 19-1, 19-2, which are arranged between a common direct voltage supply 13 and a ground 22. In this case, the switches 19-1, 19-2 are formed by n-channel MOSFETs, however they could also be p-channel MOSFETs corresponding to the embodiment according to FIG. 3. Each switch 19-1, 19-2 is associated with a control unit or gate driver 17-1 or 17-2.

One output of a clock generator unit 14 is connected with the first control unit 17-1, while a second, inverted output of the clock generator unit 14 is connected with the second control unit 17-2. Thus, each of the switches 19-1, 19-2 is clocked with a 180° phase shift. During a respective phase, in which one of the switches 19-1, 19-2 is turned off, and a high voltage and a high load current are applied to the electrode 8-1 or 8-2 through the output connection 24-1 or 24-2, the respective opposite electrode 8-2, 8-1 and the switch 19-2 or 19-1 connected to it serve as the ground electrode, since in this phase the electrode 8-2 or 8-1 is connected to ground. This embodiment advantageously no longer requires a ground electrode for the plasma chamber 2, as is indicated by the dashed lines used to draw the ground electrode 28 in FIG. 4. This basic circuit also allows more complex geometries of the plasma chamber 2 to be realized, and the active electrode surface on the chamber 2 can be doubled.

Figure 7A:
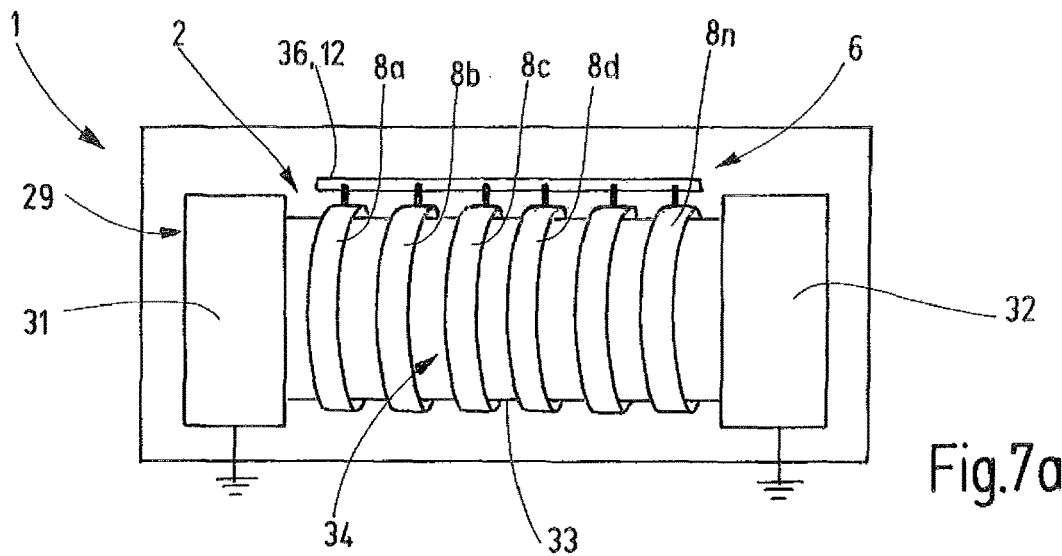
FIGS. 7a-7c are greatly simplified representations of different configurations of low-pressure plasma systems with multiple electrodes on a plasma chamber and an inventive circuit assembly according to one embodiment of the invention.
Figure 7B:
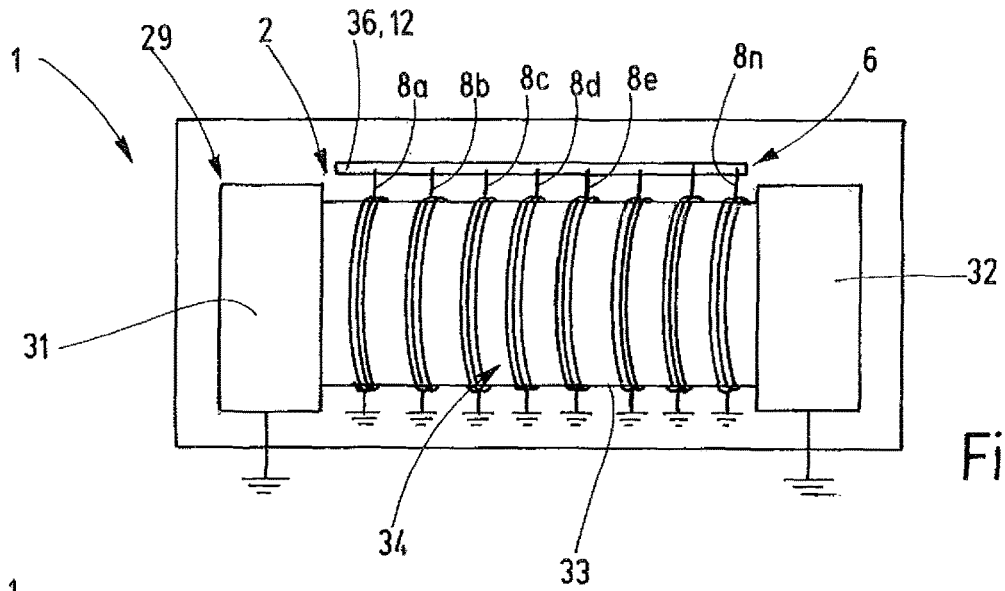
Figure 7C:
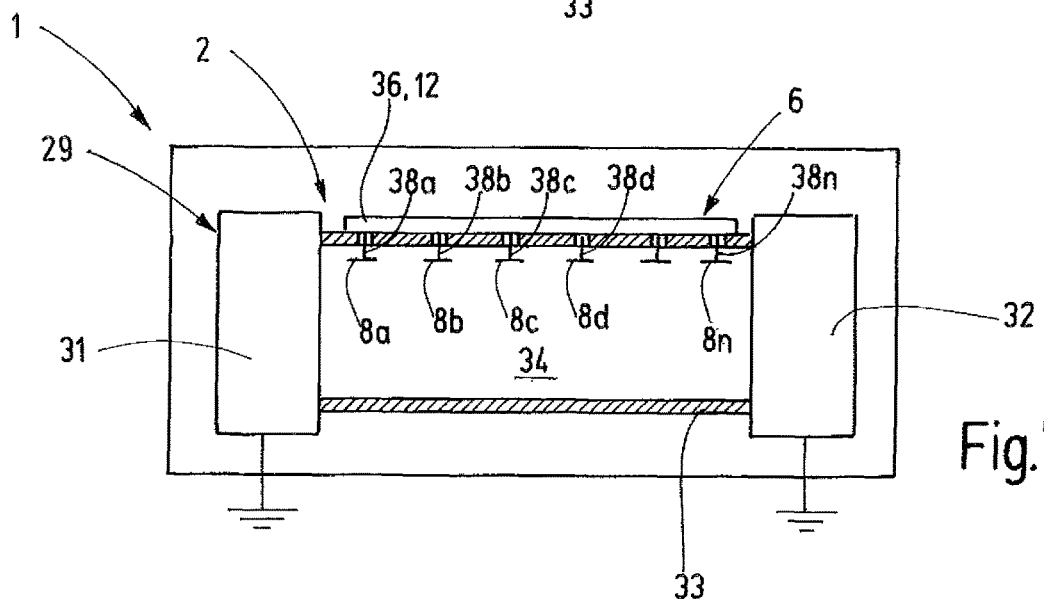

FIGS. 7a-7c show preferred implementations of inventive low-pressure plasma systems 1, which allow an especially advantageous compact and low-loss implementation. Each of these figures shows an elongated plasma chamber 2 with a chamber housing 29, including a first, front housing part 31, a second, rear housing part 32, and a chamber wall 33 that runs in the longitudinal direction of the plasma chamber 2 between the first and the second housing part 31, 32 and that surrounds an interior 34 of the plasma chamber 2. The housing parts 31, 32 and the chamber wall 33 can have a cross section that is, for example, circular, square, or rectangular, or can have another suitable cross sectional shape.

FIG. 7a shows an embodiment in which the chamber wall 33 is made, for example of glass, preferably quartz glass or borosilicate glass, and a series of electrodes 8a, 8b, . . . 8n is arranged on the outer surface of the chamber wall 33. The electrodes 8a-n are arranged uniformly distributed and equidistant in the longitudinal direction of the plasma chamber 2. Although the electrodes 8a-n illustrated here are essentially in the form of thin, flat metal rings that are arranged around the chamber wall 33, the electrodes 8a-n can alternatively be essentially plate-shaped and arranged in a linear series in the longitudinal direction of the plasma chamber 2 above, beneath, or also on a side of the chamber wall 33. In any case, it is preferable to provide a corresponding number and arrangement of the electrodes 8a-n, so that the electrodes 8a-n produce a largely homogeneous excitation of the plasma in the interior 34. The counter electrode can be formed, for example, by the metal rear housing part 32 of the chamber housing 29. The front housing part 32 can have a door, for loading work pieces.

Furthermore, in FIG. 7a a circuit board 36 is arranged in the immediate vicinity of the electrodes 8a-n. The circuit board 36 has a circuit assembly 12''' to provide high-frequency energy for the plasma chamber 2, this circuit assembly 12''' being based on one of the basic circuits 12, 12', or 12'' of FIGS. 2 through 4. The circuit assembly 12''' is illustrated in detail in FIG. 8.

Figure 8:
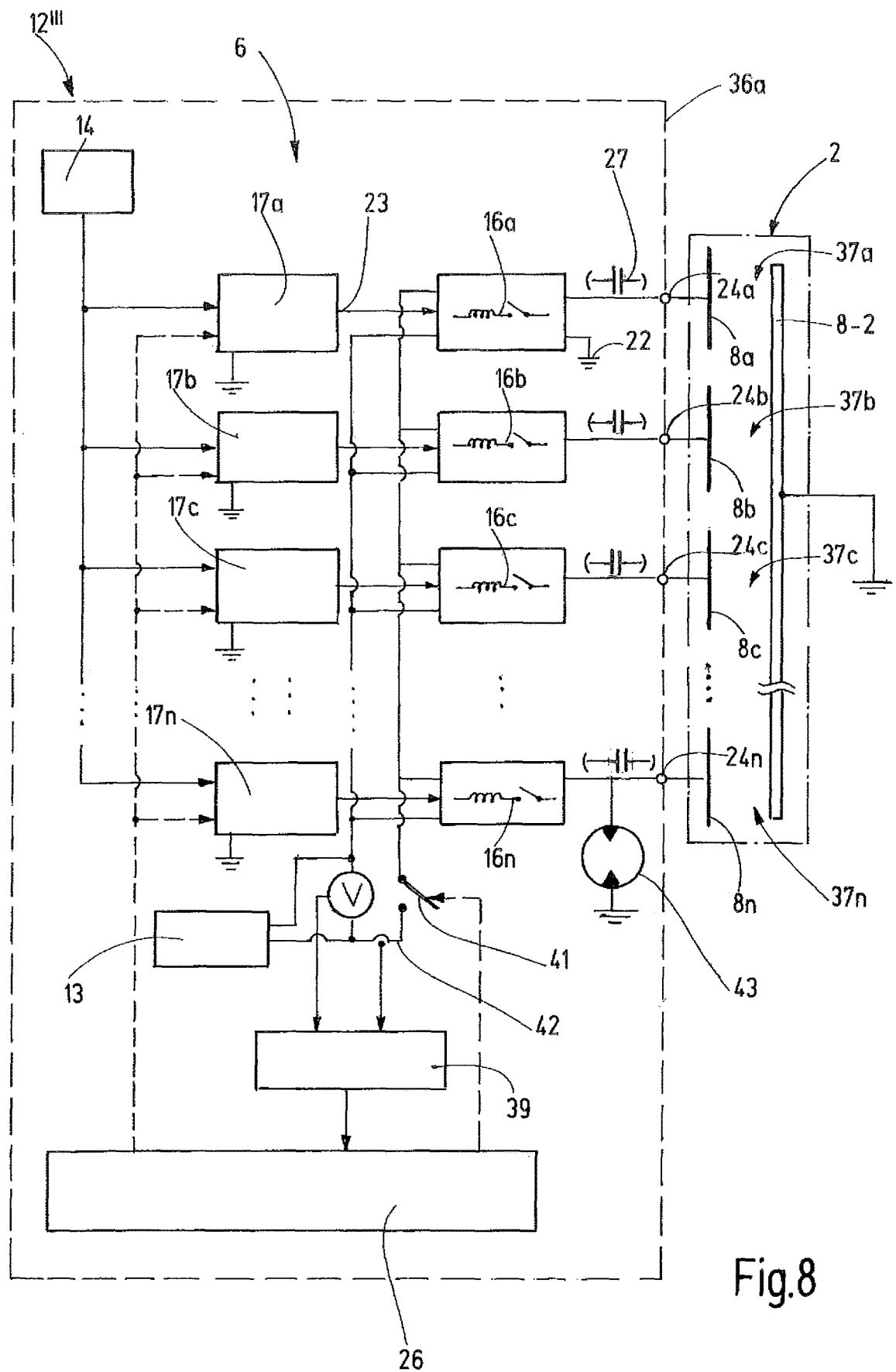
FIG. 8 is a greatly simplified block diagram illustrating the principle of the circuit assembly for providing high-frequency energy for one of the systems according to FIGS. 7a-7c.

With reference to FIG. 8, the circuit assembly 12''' has a clock generator unit 14, which supplies a time pulse signal to multiple control units 17a, 17b . . . 17n that are present. The time pulse signals are supplied to all control units 17a-n that are present synchronously, in particular within a maximum phase shift of 10%, preferably less than 2%. This can be accomplished by coordinating the lengths of the leads to the control units 17a-n.

Every control unit 17a-n is connected with an associated step-up converter circuit 16a-n that is controlled by the respective control unit. The combination of every control unit 17a-n and the associated step-up converter circuit 16a-n can be arranged as is shown in FIG. 2 or in FIG. 3. Alternatively, this combination can be replaced by the combination of two circuit and electrode pairs, each of which is clocked with a 180° phase shift, as shown in FIG. 4.

Each of the step-up converter circuits 16a-n is connected, possibly with the interposition of a direct current blocking capacitor 27 or other LC filters, if required, and through the associated output connections 24a-n, with the associated electrode 8a-n and the associated load section, or section 37a-n of the plasma chamber 2.

Returning to FIG. 7a, it can be seen that the circuit board 36 here is arranged in immediate proximity to the electrodes 8a-n. This makes it possible to realize extremely short lead paths between the drain electrodes D of the respective switches 19a-n and the associated electrodes 8a-n, these lead paths being shorter than 100 cm, preferably shorter than 20 cm, and more preferably shorter than 12 cm or only a few centimeter long. In especially preferred embodiments, the output connections 24a-n are directly connected, e.g., soldered with the electrodes 8a-n of the plasma chamber 2. It is possible to do without additional cable leads between the output connections 24a-n and the electrodes 8a-n, and the line impedances are negligible. Possibly a short, low-impedance interconnection through flat copper strips or something similar can be provided.

Alternatively or additionally, the low-pressure plasma system 1 according to FIG. 7a can be housed in a common housing 11 that holds both the plasma chamber 2 and the circuit board 36 with the circuit assembly 12'''.

Although not illustrated in FIG. 7a, the arrangement of the circuit board 36 and the components on it can further be implemented so that each switch 19a-n of the circuit assembly 12''' has a thermally conductive connection with the associated electrode 8a-n. For example, the switch 19a-n can be directly attached to the associated electrode 8a-n. Alternatively, it is possible to insert a connection element with good thermal conductivity between them. In any case, the electrodes 8a-n of the plasma chamber 2 can then serve as heat sinks for the switches 19a-n, for effective dissipation of the heat arising during high-frequency operation.

FIG. 7b shows an arrangement similar to FIG. 7a, however with inductive coupling of HF energy into the plasma chamber 2. Here the electrodes 8a-n are formed by spiral coils, each of which surrounds the chamber wall 33 of the glass chamber 2 with one or more turns. The electrodes 8a-n are once again uniformly distributed and arranged equidistant in the longitudinal direction of the plasma chamber 2, to generate a homogeneous plasma. The circuit board 36 with the circuit assembly for HF energy supply of the plasma chamber 2, in particular with the circuit assembly 12''' according to FIG. 8, is once again arranged in immediate proximity to the electrodes 8a-n, for the reasons indicated above. To avoid repetitions, it is referred to the above discussion of the embodiment according to FIG. 7a on the short, low-impedance connection paths, the possible common housing 11, and the possible use of the electrodes 8a-n as heat sinks for the switches 19a-n, which correspondingly applies here.

FIG. 7c shows an arrangement similar to that of FIG. 7a with capacitive coupling of HF energy into the plasma chamber 2, however for a metal chamber 2 and with direct coupling. Consequently, the chamber wall 33 is made of metal, preferably aluminum or stainless steel, and the electrodes 8a-n are once again arranged in the interior 34, uniformly distributed and equidistant in the longitudinal direction of the plasma chamber 2. Feed lines 38*a-n*, which pass through the chamber wall 33, connect the electrodes 8*a-n* with the circuit board 36, which carries the circuit assembly for HF energy supply of the plasma chamber 2, in particular the circuit assembly according to FIG. 8. The immediate proximity of the circuit board 36 to the electrodes 8*a-n* once again allows the feed lines 38*a-n* to be very short and low-impedance. A common housing 11 can be provided for the low-pressure plasma system 1. Moreover, for cooling purposes each switch 19*a-n* on the circuit board 36 can have a thermally conductive connection with the metal chamber wall 33, it being possible to insert, e.g., a thin electrically insulating interlayer that has good thermal conductivity in between.

Still other modifications are possible within the scope of the invention. For example, FIG. 8 shows that a monitoring device 39 can be provided, which is set up to measure voltages and currents in the circuit assembly 12, 12', 12", or 12'" (hereafter referred to simply as circuit assembly 12) and to send signals characterizing them to the controller 26. These measurement signals can be used by the controller 26 to recognize unacceptable overcurrents or overvoltages and following that to take precautions to protect the components of the circuit assembly 12. E.g., the controller 26 can contain a logic circuit that implements an overcurrent shut-off protective device that is upstream of and common to all switches 19*a-n* of the step-up converter circuits 16*a-n* and that opens a disconnect switch 41 in the common supply line 42 to the step-up converter circuits 16*a-n* to interrupt the power supply permanently or for a defined period of time if the current consumption of the entire circuit exceeds a predefinable maximum value. This is especially advantageous for protection of components and the entire system 1 in the case of unexpected short circuits in the chamber 2, which can be caused, for example, by treated objects falling over in the interior 34 of the plasma chamber 2. The disconnect switch 41 could also be cut off to protect the components if an overvoltage is detected in the common supply line 42.

Alternatively or additionally, the controller 26 can contain a logic circuit that implements an overvoltage protection device, which is able to eliminate an overvoltage. For example, it is possible to provide a triggerable discharge path, e.g., a so-called switching spark gap 43, at the output of each switch 19*a-b*, an example of which is illustrated with the switch 19*n* in FIG. 8, this triggerable discharge path being arranged parallel to the respective step-up converter circuit 16*a-n* to be protected. If there is an overvoltage condition at one of the outputs 24*a-n*, the respective discharge path 43 can be triggered automatically, to eliminate the overvoltage. Alternatively, the controller 26 could also recognize an overvoltage condition and trigger the corresponding discharge path 43. Such overvoltage protectors based on discharge paths or switching spark gaps are generally known in the art, and can be used here.

Furthermore, a protective device against over-temperature can optionally be provided.

Moreover, it is possible to arrange the circuit assembly 12'" according to FIG. 8 distributed on two or more circuit boards 36*i* (1=1 . . . m) (not shown). This also allows a very large plasma chamber 2 with multiple electrodes 8*a-n* to be excited homogeneously and with very high HF energy. The circuit boards 36*i* can be connected parallel to one another, each having its own direct voltage supply 13 and being supplied with a common time pulse signal from a common clock generator unit 14. In an especially preferred embodiment, the lead connections can be suitably routed and time delay elements can be included in the lead connections to ensure that a common time pulse is supplied largely synchronously to all control units 17*a-n* on all circuit boards 36*i*. Protection against overvoltage, overcurrent, and/or over-temperature is preferably provided separately for each circuit board 36*i*.

Irrespective of how many circuit boards are used, the multiple switches 19*a-n* also offer advantageous redundancy. If a single switch 19*a-n* fails, other switches can continue to operate, so that segments of the plasma chamber 2 continue to be supplied with HF energy, the homogeneity of the plasma generation possibly being only slightly affected.

In another embodiment of the invention illustrated in FIG. 9, the electrodes 8*a-n* of one of the low-pressure plasma systems 1 explained above can be electrically connected with one another, for example, through a thin, flat piece of sheet metal 44, to form a single common active electrode 8 for the plasma chamber 2. This makes it possible, e.g., by means of the circuit assembly 12'", to apply to the plasma chamber a clearly higher additive HF power, which could even be 10 kW or more. Moreover, the HF power can be fed more homogeneously and synchronously through the enlarged electrode 8 than it can be fed through a point source, which can improve the homogeneity of the plasma that is generated. Although the electrodes 8*a-n* or the output connections 24*a-n* of the circuit assembly 12'" are galvanically connected here, this is insignificant at the operating frequency of the output voltage applied to the output connections 24*a-n*. The piece of sheet metal 44 for the high frequency can be considered a network 46 of multiple inductors 47 connected in series and parallel with one another, so that HF technically there is no short circuit.

A circuit assembly 12 is created to provide high-frequency energy in order to generate an electric discharge in a vacuum chamber 2, in particular in order to generate plasma, this circuit assembly 12 having a direct voltage supply 13, a step-up converter circuit 16, and a control unit 17. The direct voltage supply 13 provides a direct voltage $U_{cc}$. The step-up converter circuit 16 contains a series circuit consisting of an inductor 18 and a controllable switch 19, wherein the inductor 18 is connected between a pole 21 of the direct voltage supply 13 and a first electrode D of the switch 19. A second electrode S of the switch 19 is connected to ground, and the switch 19 additionally has a control electrode G. The control unit 17 is configured to control the switch 19 with a high-frequency in order to generate high-frequency energy with a periodic pulse-like output voltage $U_{DS}$ at the first electrode D of the switch 19, said output voltage having a peak value which is larger than the value of the direct voltage $U_{cc}$ of the direct voltage supply 13. The high-frequency energy with the output voltage $U_{DS}$ is directly output without transformation at an output connection 24 which is designed to directly connect to an electrode 8 of the vacuum chamber 2. A system is created for generating an electric discharge, in particular a low-pressure plasma system, comprising such a circuit assembly 12.

The invention claimed is:

1. An apparatus comprising a circuit assembly for providing high-frequency energy in order to generate an electric discharge in a vacuum chamber, the circuit assembly comprising:
   a direct voltage supply (13) configured to provide a direct voltage ($U_{cc}$);
   a step-up converter circuit (16) that contains a series circuit consisting of an inductor (18) and a controllable switch (19), wherein the inductor (18) is connected between a pole (21) of the direct voltage supply (13) and a first electrode (D) of the switch (19), wherein a second electrode (S) of the switch (19) is connected to ground, and the switch (19) additionally comprises a control electrode (G);

a control unit (17) that is configured to control the switch (19) with a high-frequency in order to generate high-frequency energy with a periodic pulse-like output voltage ($U_{DS}$) at the first electrode (D) of the switch (19), said output voltage having a peak value which is larger than the value of the direct voltage ($U_{cc}$) of the direct voltage supply (13), and an output connection (24) configured for direct connection with an electrode (8) of the vacuum chamber (2), without interposition of an impedance matching network and that is connected with the first electrode (D) of the switch (19), to apply the high-frequency energy with the output voltage ($U_{DS}$) to the vacuum chamber (2).

2. The apparatus according to claim 1, wherein the circuit assembly is free of a resonant circuit made of a coil and a capacitor, or formed by feedback, that is coupled with the switch (19) and/or excited by the switch (19) to generate an HF alternating voltage applied to the output connection, and wherein the circuit assembly is free of adjustable components designed to match impedance of the switch's (19) output to a load to be connected to the output connection (24).

3. The apparatus according to claim 1, wherein the circuit assembly is designed for operation with low-pressure plasma systems that have a plasma chamber (2) with a working pressure that is less than atmospheric pressure.

4. The apparatus according to claim 1, wherein the direct voltage is between 0 to 400 V, the output voltage ($U_{DS}$) has peak values between 250 to 900 volts, and the high-frequency and a frequency of the output voltage ($U_{DS}$) is an ISM frequency ($f_{ISM}$) that is selected from 6.78 MHz, 13.56 MHz, 27.12 MHz, or 40.68 MHz.

5. The apparatus according to claim 1, wherein the inductor (18) is dimensioned so that when combined with a capacitive component of the vacuum chamber's (2) impedance, the vacuum chamber's (2) electrodes (8), parasitic capacitances to ground of the switch (19) and of a circuit board supporting the circuit assembly (12), the inductor (18) produces a resonant frequency that lies in a range from $0.5 \times f_{ISM}$ to $1.5 \times f_{ISM}$, where $f_{ISM}$ is the output voltage ($U_{DS}$) frequency.

6. The apparatus according to claim 1, wherein the controllable switch (19) is a power semiconductor switch.

7. The apparatus according to claim 1, wherein the controllable switch (19) has an input capacitance that is less than 5 nF, a reverse voltage that is greater than 500 V, and rise times and fall times that are less than 15 ns, and wherein the control unit (17) is configured to control the switch (19) with an actuation current of less than 10 A.

8. The apparatus according to claim 1, further comprising a controller (26) configured to operate the circuit assembly (12) by providing an ignition operation mode in which the output voltage ($U_{DS}$) generated exceeds that in a normal operation mode by an amount that is at least 10% of a mean of the output voltage in the normal operation mode.

9. The apparatus according to claim 8, wherein the controller (26) is configured to periodically cause the ignition operation mode with a frequency that is significantly lower than the high operating frequency in ongoing operation.

10. The apparatus according to claim 1, further comprising two or more step-up converter circuits (16a-n) connected to a common direct voltage supply with associated output connections (24a-n) to couple the high-frequency energy to the vacuum chamber (2), and a number of control units (17a-n) each of which is associated with one or two step-up converter circuits (16a-n).

11. The apparatus according to claim 10, further comprising a clock generator unit (14) configured to supply a timing clock signal to the control units (17a-n) so that they operate synchronously, within a maximum phase shift of 10°.

12. The apparatus according to claim 1, further comprising one or more of:

a common overcurrent protection device which is upstream of all switches (19) of the step-up converter circuits (16) and is configured to interrupt a power supply if current consumption of the circuit assembly reaches a configurable level;

an overvoltage protection device that comprises a discharge path (43), which triggers or is triggered in the case of an overvoltage, to eliminate the overvoltage; or a protective device against over-temperature.

13. The apparatus of claim 1 further comprising the vacuum chamber (2).

14. The apparatus according to claim 13, wherein the circuit assembly (12) is implemented on a circuit board (36) that is arranged in immediate proximity to the vacuum chamber (2).

15. The apparatus according to claim 13, configured such that one or both of:

an electrical connection path between the first electrode (D) of the controllable switch (19) of the circuit assembly (12) and the electrode (8) of the vacuum chamber (2) is shorter than 100 cm; or an inductance of the electrical connection path between the first electrode (D) of the controllable switch (19) of the circuit assembly (12) and the electrode (8) of the vacuum chamber (2) is less than 10 µH.

16. The apparatus according to claim 13, wherein the vacuum chamber has a chamber wall (33) made of glass that surrounds an interior (34) of the vacuum chamber (2), the electrodes (8a-n) being arranged on an outer surface of the chamber wall (33) equidistantly in a longitudinal direction of the vacuum chamber (2).

17. The apparatus according to claim 16, wherein the switch (19a-n) of the circuit assembly (12''') has a thermally conductive connection with the electrode (8a-n) of the vacuum chamber.

18. The apparatus according to claim 13, wherein the vacuum chamber has a chamber wall (33) made of metal, which surrounds an interior (34) of the vacuum chamber (2), the electrodes (8a-n) of the vacuum chamber (2) projecting into the interior (34) of the vacuum chamber (2) equidistantly in a longitudinal direction of the vacuum chamber (2) and a capacitor (27) being connected between the switch (19a-n) and the electrode (8a-n) of the vacuum chamber to suppress a direct voltage component of the high frequency output voltage.

19. The apparatus according to claim 18, wherein the switch (19a-n) of the circuit assembly (12''') has a thermally conductive connection with the metal chamber wall.

20. The apparatus according to claim 13, further comprising multiple circuit assemblies (12, 12', 12'', 12''') arranged distributed on a number of circuit boards (36i), which are connected to one another in parallel, each of which fed by its own direct voltage supply (13) and supplied with a common timing clock signal from a common clock generator (14), and having lead connections being routed and containing time delay elements so that the common timing clock signal is supplied to all control units (17*a-n*) effectively synchronously, and each circuit board (36*i*) comprising its own protection against overvoltage and/or over-current and/or over-temperature.

21. The apparatus according to claim 13, wherein two or more output connections (24*a-d*) of the circuit assembly (12) have an electrically conductive connection with one another to form a single common active electrode (8) for the vacuum chamber (2).

\* \* \* \* \*